United States Patent [19]

Van Kessel et al.

[11] 4,430,609
[45] Feb. 7, 1984

[54] SIGNAL TRANSFER DEVICE HAVING A TRANSFER CHARACTERISTIC WHICH IS ADJUSTABLE IN STEPS

[75] Inventors: Theodorus J. Van Kessel; Eise C. Dijkmans; Albertus J. P. M. Van Uden, all of Eindhoven, Netherlands

[73] Assignee: U.S. Philips Corporation, New York, N.Y.

[21] Appl. No.: 332,896

[22] Filed: Dec. 21, 1981

[30] Foreign Application Priority Data

Jan. 7, 1981 [NL] Netherlands ................. 8100033

[51] Int. Cl.³ ............................................. H03G 3/30
[52] U.S. Cl. ................................. 323/350; 323/351; 323/354; 323/272; 455/249; 330/284
[58] Field of Search ........ 323/268, 271, 272, 350–351, 323/352–354; 330/149, 254, 278, 284; 455/177, 232, 246, 247, 249

[56] References Cited

U.S. PATENT DOCUMENTS

| | | | |
|---|---|---|---|
| 2,969,457 | 1/1961 | Felix et al. | 323/350 |
| 3,581,222 | 5/1971 | Dunwoodie | 455/249 X |
| 3,757,240 | 9/1973 | Fogg | 330/284 X |
| 4,015,192 | 3/1977 | Koyanagi | 323/350 |
| 4,055,773 | 10/1977 | Schoeff | 323/354 X |
| 4,278,945 | 7/1981 | Schroder et al. | 330/278 |

Primary Examiner—Peter S. Wong
Attorney, Agent, or Firm—Robert T. Mayer; Bernard Franzblau

[57] ABSTRACT

A step-controlled attenuator circuit which, in order to avoid audible switching clicks in audio equipment, employs current-controlled switches. A switch is switched on by means of a gradually increasing control current and a switch to be switched off is turned off by means of a gradually decreasing control current.

14 Claims, 6 Drawing Figures

FIG.1

| 5 | 7 | 10 | |
|---|---|---|---|
| ↓$L_1$ | $L_2$ | $D_1$ | → $D_7$ |
| ↓$L_3$ | ↓$L_2$ | $D_7$ | → $D_1$ |
| $L_3$ | ↓$L_4$ | $D_1$ | → $D_7$ |
| ↓$L_5$ | $L_4$ | $D_7$ | → $D_1$ |
| $L_5$ | ↓$L_6$ | $D_1$ | → $D_7$ |
| ↓$L_7$ | $L_6$ | $D_7$ | → $D_1$ |
| $L_7$ | ↓$L_8$ | $D_1$ | → $D_7$ |
| ↓$L_9$ | $L_8$ | $D_7$ | → $D_1$ |
| $L_9$ | ↓$L_{10}$ | $D_1$ | → $D_7$ |
| ↓$L_{11}$ | $L_{10}$ | $D_7$ | → $D_1$ |
| $L_{11}$ | ↓$L_{12}$ | $D_1$ | → $D_7$ |
| ↓$L_{13}$ | $L_{12}$ | $D_7$ | → $D_1$ |
| $L_{13}$ | ↓$L_{14}$ | $D_1$ | → $D_7$ |
| $L_{15}$ | $L_{14}$ | $D_7$ | → $D_1$ |
| $L_{15}$ | ↓$L_{16}$ | $D_1$ | → $D_7$ |

SIGNAL TRANSFER DEVICE HAVING A TRANSFER CHARACTERISTIC WHICH IS ADJUSTABLE IN STEPS

The invention relates to a signal transfer device having a transfer characteristic which is adjustable in steps, which device comprises at least one group of controllable switches for transferring a signal from different inputs to an output, control means being provided for each time turning on one of said switches, which switches can be turned on and off by means of a control signal.

Such devices may be used for volume or tone control in audio amplifiers, such a volume control being, for example, known from Netherlands Patent Application No. 7811229, which has been laid open to public inspection. Electronic switches frequently exhibit an error voltage. If the device is changed over, a varying d.c. signal is produced, which d.c. signal comprises the successive different error voltages. In audio equipment the transitions between these different error voltages are reproduced as switching clicks, which are experienced as very annoying, particularly in the absence of a signal.

It is an object of the invention to provide a device of the type mentioned in the opening paragraph which does not have this drawback, and to this end the device is characterized in that there is provided a control-signal generator for generating a first control signal which gradually varies in time for gradually turning on a specific switch of said group, and for generating a second control signal, which is complementary to the first control signal, for at the same time gradually turning off another switch of said group.

Owing to the step in accordance with the invention the error voltages smoothly change into each other upon turn-on and hardly give rise to audible switching clicks.

The signal transfer device in accordance with the invention may further be characterized in that the group of switches is constituted by a group of differential pairs, each pair comprising a first and a second transistor whose collector output circuits lead to the output. The base electrode of the first transistors each individually lead to said different inputs, the base electrodes of the second transistors lead to a common terminal, and the emitter electrodes of the first and second transistors of each pair are connected to a control-signal input for receiving said control signals as a control current. This embodiment may further be characterized in that said common terminal is connected to the output so as to obtain a negative feedback. In this respect it is very advantageous that the switches can be switched on and off in a specific sequence and that the control signal inputs, in said sequence, are alternately connected to a first and a second output of the signal generator via transistor switches which can be controlled in such a way that each time only the emitter side of the transistor pair to be switched on and off is connected to the control signal generator.

With respect to the control signal generator, the signal transfer device may further be characterized in that the signal generator comprises a digital-to-analog converter synchronized by the control means for generating the control signals.

It is then advantageous that the control signal generator comprises a digital up/down counter which is controlled by a clock signal, which clock signal also synchronizes the control means. The count of said counter is applied to the digital-to-analog converter as an input signal.

The invention will now be described in more detail with reference to the drawing, which shows a preferred embodiment of a signal-transfer device in accordance with the invention and in which.

Figure 1:
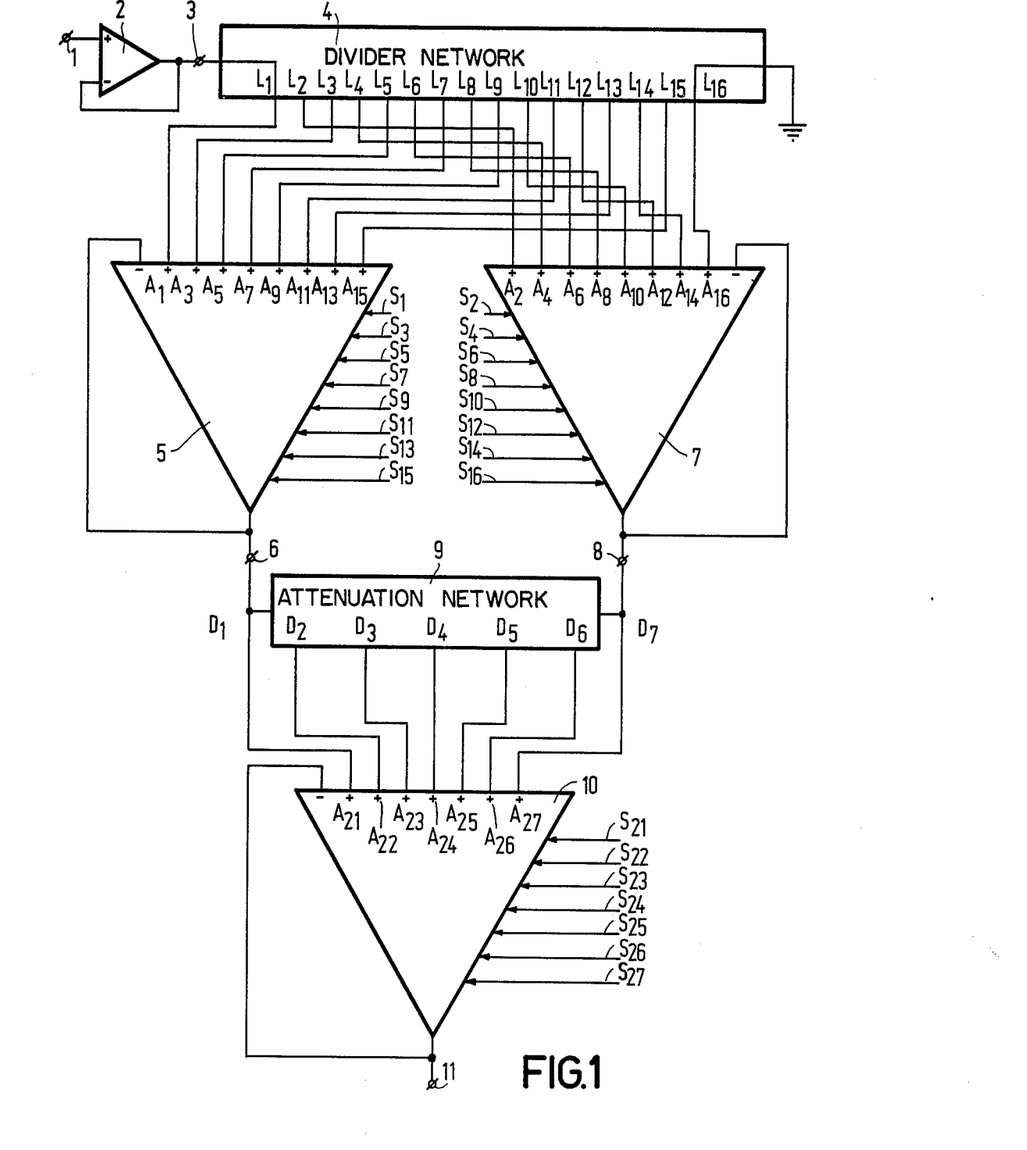
FIG. 1 represents the principle of the signal transfer device.
Figure 2:
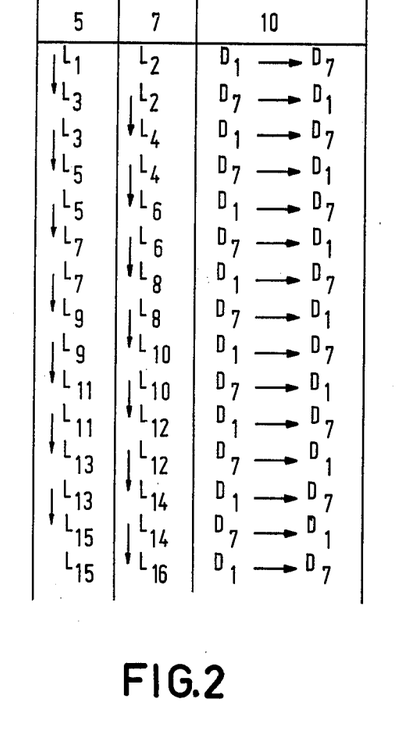
FIG. 2 is a table to explain the operation of the device shown in FIG. 1.

FIG. 1 shows an embodiment of a step-controlled volume control circuit using the principle in accordance with the invention. The volume control comprises a signal input 1, which is connected to an amplifier 2, arranged as a voltage follower, having an output 3. Via a resistive divider network 4 the output 3 is connected to ground. The resistive divider network 4 is a so-called R-2R ladder network which provides an attenuation of 6 dB per step and which has 16 tappings $L_1$ to $L_{16}$. The tapping $L_1$ supplies the full output voltage of the follower 2 and tapping 16 is connected to ground. The tappings $L_1$, $L_3$, $L_5$, $L_7$, $L_9$, $L_{11}$, $L_{13}$ and $L_{15}$ lead to a switching amplifier 5, which upon command of switching signals at inputs $S_1$, $S_3$, $S_5$, $S_7$, $S_9$, $S_{11}$, $S_{13}$ and $S_{15}$ connects one of said tappings to an output 6. The other tappings $L_2$, $L_4$, $L_6$, $L_8$, $L_{10}$, $L_{12}$, $L_{14}$ and $L_{16}$ of the resistive divider network 4 lead to a switching amplifier 7, which on command of switching signals at inputs $S_2$, $S_4$, $S_6$, $S_8$, $S_{10}$, $S_{12}$, $S_{14}$ and $S_{16}$ connects one of said tappings to an output 8. The two switching amplifiers 5 and 7 are controlled in such a way that the outputs 6 and 8 each time carry the signals on two successive tappings, namely in such a way that each time one of the two switching amplifiers is switched to a following switching position. At the smallest attenuation the amplifier 5 connects tapping $L_1$ to output 6 and amplifier 7 connects tapping $L_2$ to output 8. The next attenuation step is obtained by turning on amplifier 5 so that tapping $L_3$ is connected to output 6. Subsequently, amplifier 7 is switched over so that tapping $L_4$ is connected to output 8. In this way the entire network 4 can be covered, outputs 6 and 8 always being connected to two successive tappings of the network 4 in such a way that outputs 6 and 8 alternately carry the highest signal level. This has the advantage that each time only one of the two amplifiers 5 and 7 is switched over. Between outputs 6 and 8 a linear attenuation network 9 is connected with tappings $D_1$, $D_2$, $D_3$, $D_4$, $D_5$, $D_6$ and $D_7$. The tappings $D_1$ and $D_7$ respectively carry the voltages at outputs 6 and 8. The tappings $D_1$ to $D_7$ can each in turn be connected to an output 11 by means of a switching amplifier 10 on command of switching signals $S_{21}$ to $S_{27}$. The switching sequence of the tappings $D_1$ to $D_7$ is each time changed depending on the switching position of the switching amplifiers 5 and 7. If the amplifier 5 is in a position in which the tapping $L_1$ is connected-through and amplifier 7 is in a position in which tapping $L_2$ is connected-through, the switching amplifier 10 successively connects the tappings $D_1$ to $D_7$ to the output 11 with increasing attenuation. If subsequently at increasing attenuation the amplifier 5 is switched over so that it connects tapping L3 to output 6, then switching amplifier 10 successively connects tappings $D_7$ to $D_1$ to output 11 with increasing attenuation. The complete switching sequence is diagrammatically represented in FIG. 2, in which the two left-hand columns represent the relevant tapping of the resistive divider network 4 which is switched by the relevant amplifiers 5 and 7, the vertical arrows indicating the switching sequence, and in which the right-hand column represents the switching direction of the amplifier 10. It can be seen that the switching amplifiers 5 and 7 are each time changed over when the switching amplifier 10 has connected the respective tappings $D_7$ and $D_1$, which are connected to the respective non-switching amplifier 7 and 5, to output 11, which has the important advantage that switching clicks, caused by the switching amplifiers 5 and 7, cannot reach output 11.

In the control circuit of FIG. 1, the switching amplifiers 5, 7 and 10 are constructed as differential amplifiers having alternately switchable non-inverting inputs ($A_1$, $A_3$, $A_5$, $A_7$, $A_9$, $A_{11}$, $A_{13}$, $A_{15}$), ($A_2$, $A_4$, $A_6$, $A_8$, $A_{10}$, $A_{12}$, $A_{14}$, $A_{16}$) and ($A_{21}$, $A_{22}$, $A_{23}$, $A_{24}$, $A_{25}$, $A_{26}$, $A_{27}$) respectively, which can be switched by a signal at the control inputs S of a corresponding sequence number. A signal at control input $S_{21}$, for example, activates input $A_{21}$. The switching amplifiers have an inverting input (−) connected to the relevant output so that the amplifiers act as voltage followers for the signal on at the switched input.

Figure 3:
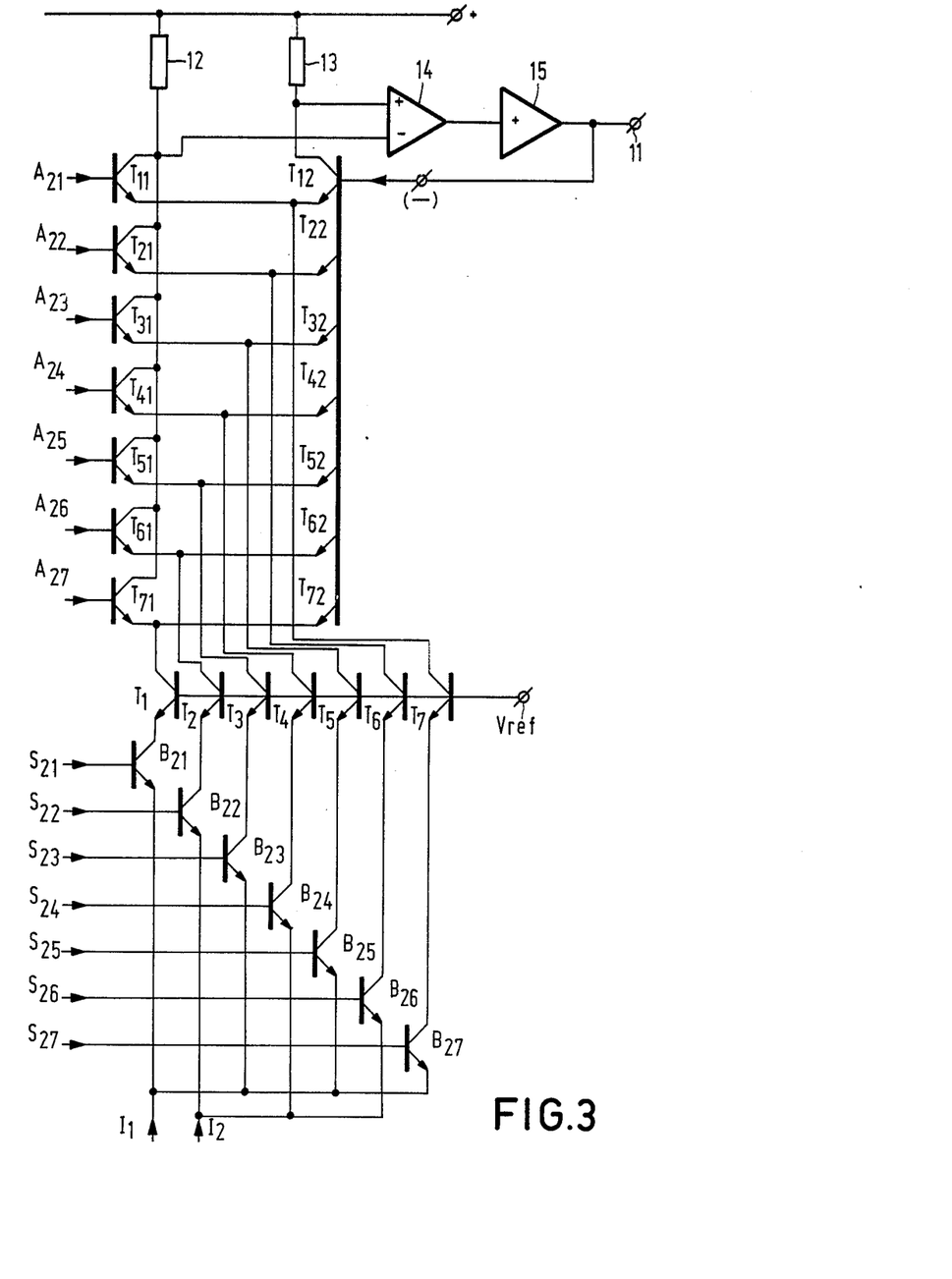
FIG. 3 shows an example of switchable amplifiers employed in the device shown in FIG. 1.

FIG. 3 shows an example of such a switching amplifier, namely the switching amplifier 10. It comprises 7 differential transistor pairs ($T_{11}$, $T_{12}$), ($T_{21}$, $T_{22}$), ($T_{31}$, $T_{32}$), ($T_{41}$, $T_{42}$), ($T_{51}$, $T_{52}$), ($T_{61}$, $T_{62}$) and ($T_{71}$, $T_{72}$). The base electrodes of the transistors $T_{11}$, $T_{21}$, $T_{31}$, $T_{41}$, $T_{51}$, $T_{61}$ and $T_{71}$ are individually connected to the corresponding inputs $A_{21}$, $A_{22}$, $A_{23}$, $A_{24}$, $A_{25}$, $A_{26}$ and $A_{27}$, the emitter electrodes each being connected to the emitter electrodes of the corresponding other transistor of the pair $T_{12}$, $T_{22}$, $T_{32}$, $T_{42}$, $T_{52}$, $T_{62}$ and $T_{72}$ and the collector electrodes being jointly connected to positive power supply terminal (+) via a collector load 12. The base electrodes of the other transistors of the pairs are jointly connected to the inverting input (−) and the collector electrodes are jointly connected to the positive supply terminal via a collector load 13. As a result of this, the transistors—as is shown—may be constituted by multi-emitter transistors. The collector signals appearing across the loads 12 and 13 are amplified to an output 11 via a differential amplifier 14 and an output amplifier 15 and are then fed back to the inverting input (−).

In order to enable the inputs $A_{21}$ to $A_{27}$ to be activated individually, the emitter electrodes of the respective transistor pairs ($T_{11}$, $T_{12}$) to ($T_{71}$, $T_{72}$) are connected to emitter-current sources via the respective isolating transistors $T_1$ to $T_7$, whose base electrodes are connected to a source of reference voltage $V_{ref}$, and via the respective switching transistors $B_{21}$ to $B_{27}$, whose base electrodes are each connected to the respective control inputs $S_{21}$ to $S_{27}$, which emitter-current sources may for example be resistors, so that by turning on the relevant switch an emitter current is produced which is determined by the reference voltage $V_{ref}$ and the value of the relevant resistor, as a result of which emitter current the corresponding input is activated and the signal present on said input appears on output 11. The amplifiers 5 and 7 may be constructed in a corresponding manner.

Figure 4:
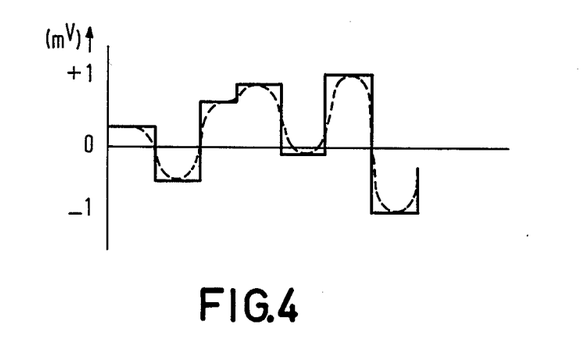
FIG. 4 is a signal diagram to explain the operation of the switchable amplifier shown in FIG. 3.

As already stated, the switching clicks produced in amplifiers 5 and 7 do not appear at output 11 in the control circuit shown in FIG. 1. However, the switching clocks produced in the amplifier 10 do appear at said output. These switching clicks are caused by each other pair exhibiting a specific error voltage so that this error voltage appears at output 11 as a low-frequency ripple as the various switching positions are passed through. FIG. 4 (continuous line) represents such a signal. In the case of suitably dimensioned integrated amplifiers this signal may still have a peak-to-peak value of ±2 mV. Although the switching signal itself is of comparatively low frequency, this switching signal, especially in the absence of an audio signal, will be reproduced as switching clicks, which switching clicks are determined by the higher harmonics associated with the steep edges of an error signal. These audible switching clicks can be avoided by not abruptly changing from the one to the other transistor pair (FIG. 3), but by simultaneously causing the emitter current of the turned-on pair to decrease and causing the emitter current of the pair to be switched to increase, so that a gradual transition from the one to the other error signal at output 11 is obtained, which is represented by the broken line in FIG. 4. As the present embodiment of the control circuit employs a fixed switching sequence, in which consecutively the switching transistors $B_{21}$, $B_{22}$, $B_{23}$, $B_{24}$, $B_{25}$, $B_{26}$ and $B_{27}$ are turned off and on, it suffices to use two currents $I_1$ and $I_2$ which increase and decrease in phase opposition. Via the relevant switches—of which only one switch conducts at a time—the current $I_1$ is applied to the transistor pairs corresponding to inputs $A_{21}$, $A_{23}$, $A_{25}$ and $A_{27}$ and the current $I_2$ to the other transistor pair. The currents $I_1$ and $I_2$ can for example be obtained by means of a digital-to-analog converter controlled by a binary up/down counter.

Figure 5:
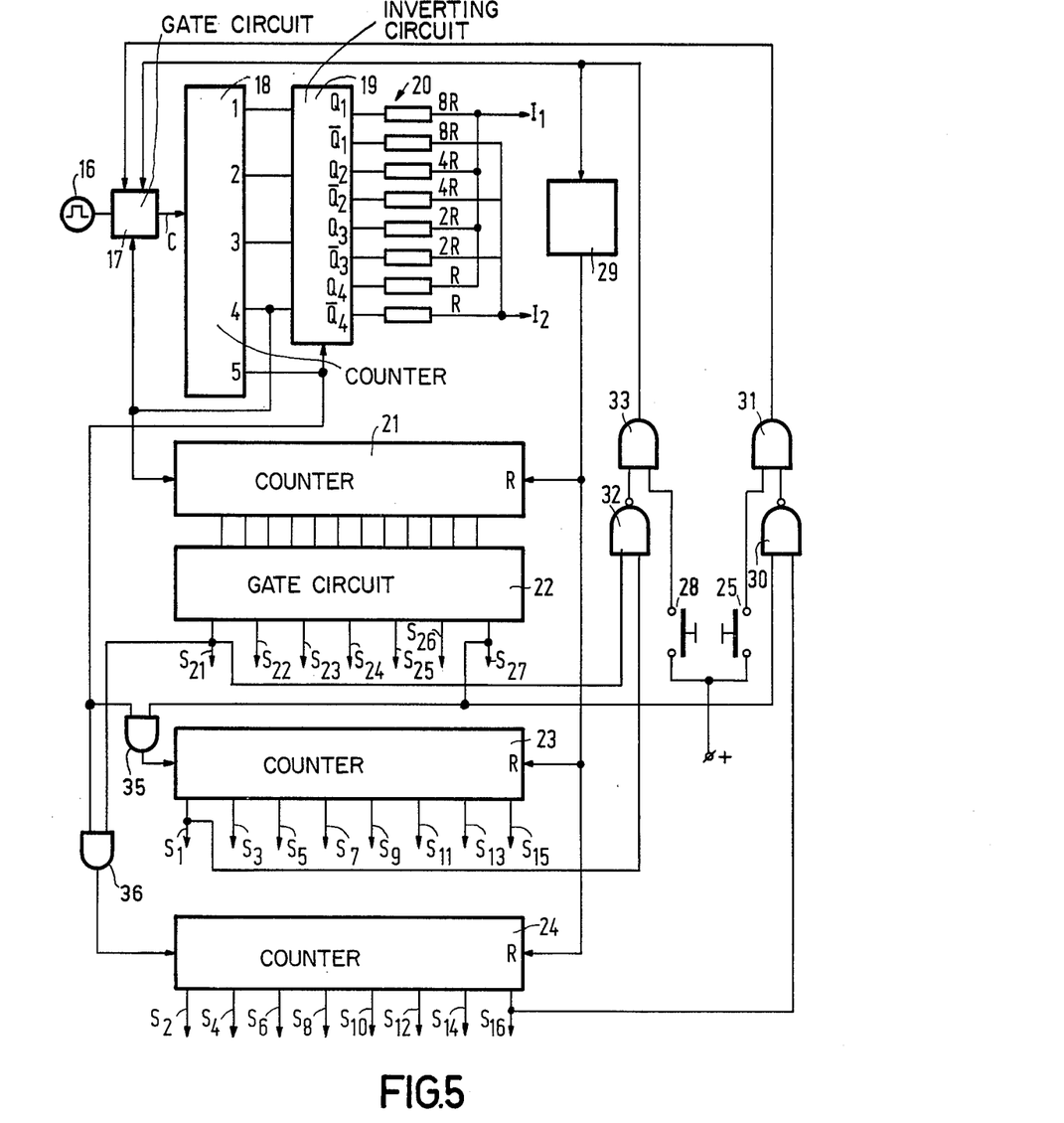
FIG. 5 shows an example of the control logic for controlling the device shown in FIG. 1.
Figure 6:
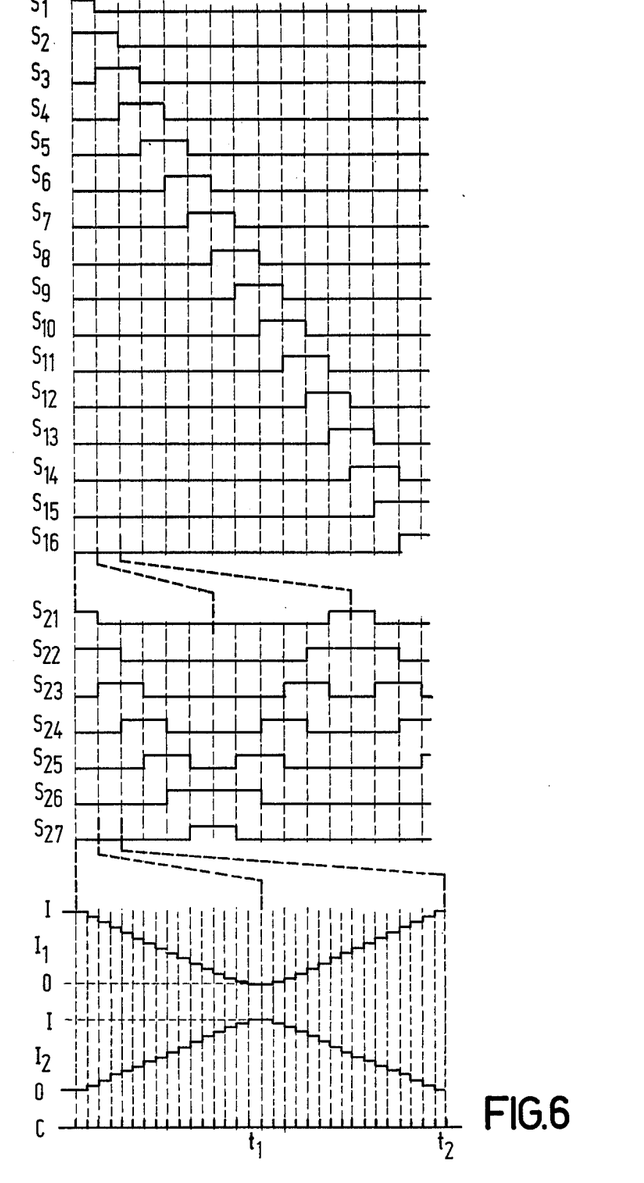
FIG. 6 is a time diagram of a number of signal generated by the control logic shown in FIG. 5.

FIG. 5 shows an example of a control device for generating the signals $I_1$ and $I_2$ and the control signals $S_1$ to $S_{16}$ and $S_{21}$ to $S_{27}$. FIG. 6 represent a number of signals to explain the operation.

This device comprises a clock generator 16, which via a gate circuit 17 produces a clock signal c (FIG. 6). This clock signal controls a 5-bit counter 18, whose first four (1 to 4) bits are employed as a binary input signal for the digital-to-analog converter. The fifth (5) and most significant bit is employed for changing over an inverting gate circuit, which inverts the first four bits. In this way the first four bits pass through a cycle from 0000 to 1111 and subsequently through the same cycle, but inverted, so that the four bits appearing at the outputs $Q_1$ to $Q_4$ of the inverting circuit 19 each time pass through an up-down cycle (0000→1111→0000). The inverting circuit 19 is assumed to be a so-called "open-collector" logic circuit, that is, the relevant output is connected to ground or is floating. Digital-to-analog conversion is then effected by arranging binary weighted resistors 20 with the values 8R, 4R, 2R and R at said outputs, so that in conjunction with the reference voltage $V_{ref}$ applied via transistors $T_1$ to $T_7$ (FIG. 3) the desired current $I_1$ (FIG. 6) is obtained. The inverse current $I_2$ (FIG. 6) is obtained in a corresponding manner by producing the inverse of the four bits in the inverting circuit 19 at outputs $\overline{Q}_1$, $\overline{Q}_2$, $\overline{Q}_3$ and $\overline{Q}_4$ and by also connecting said outputs to binary weighted resistors.

After each cycle of the digital-to-analog converter, for example at the instants $t_1$ and $t_2$ (FIG. 6) switching amplifier 10 should be switched one step further. For this purpose, the switching signals $S_{21}$ to $S_{27}$ (shown in FIG. 6) are generated by means of a 12-position counter 21, whose output signals are combined by means of the gate circuit 22, so that the desired sequence of switching signals $S_{21}$ to $S_{27}$ is obtained. These switching signals should each time overlap each other for half the time because each time two consecutive ones of the switching transistors $B_{21}$ to $B_{27}$ should conduct for the said emitter current cross-over ($I_1$ and $I_2$ in FIG. 6). The counter 21 is controlled by the fourth bit (4) from counter 18 so that the switching signals $S_{21}$ to $S_{27}$ are generated synchronously with the alternation of the currents $I_1$ and $I_2$ (as is illustraed in the timing diagram of FIG. 6).

Each time that switching amplifier 10 connects input $A_{21}$ to output 11, switching amplifier 7 should make one switching step (in accordance with the table of FIG. 2) and each time that the switching amplifier (10) connects input $A_{27}$ to output 11, the switching amplifier 5 should perform one switching step. For this purpose the signal $S_{27}$ controls, via an AND-gate 35, an 8-position counter 23 which supplies the switching signals $S_1$, $S_3$, $S_5$, $S_7$, $S_9$, $S_{11}$, $S_{13}$ and $S_{15}$ in accordance with the timing diagram of FIG. 6. The signal $S_{21}$ controls, via an AND-gate 36, and 8-position counter 24 which supplies the switching signals $S_2$, $S_4$, $S_6$, $S_8$, $S_{10}$, $S_{12}$, $S_{14}$ and $S_{16}$ in accordance with the timing diagram of FIG. 6. Both AND-gates 35 and 36, whose other inputs are connected to output 5 of counter 18, are needed so that the counters 23 and 24 are clocked at the centres of the pulses $S_{27}$ and $S_{21}$ respectively.

The progressive attenuation is activated by depressing a button 25 so that, via the gate circuit 17' the clock signal c is applied to counter 18. The gate switch 17 is such that it allows the clock signal to be transferred after release of the button 25 until the counter 18 has completed a current change via the digital-to-analog converter, which is effected by applying the $4^{th}$ bit (4) of the counter 18 to the gate circuit 17, the start signal from the button 25 being prevalent.

In order to allow an increase in volume, the counters 21, 23 and 24 are provided with a counting sequence reversing input R. By means of a signal at this input the counting sequence can be reversed in a manner known per se. The counter 18 need not be reversed because the counters 21, 23 and 24 can only perform one counting step upon each completion of a change of the currents $I_1$ and $I_2$ and because the changing pattern of the currents $I_1$ and $I_2$ does not depend on the switching direction. A volume increase is initiated by pressing the pushbutton 28, after which a circuit 29 generates the signals for the counting sequence reversing input R and after which the gate circuit 17 transfers the clock signal. When the button 25 is depressed, the volume of the signal being produced decreases to zero, after which, if all counters would keep on counting, the maximum volume would be reproduced again all of a sudden, which is very annoying. In order to preclude this, the maximum attenuation position is decoded by combining the control signals $S_{27}$ and $S_{16}$ by means of the NAND-gate 30. Via the AND-gate 31 the output of this NAND-gate 30 blocks the signal from the push-button 25 when the maximum attenuation is reached. In a corresponding manner, by combining the signals $S_{21}$ and $S_1$ by means of a NAND-gate 32 and, as a function thereof, blocking the signals from push-button 28, the clock signal is blocked by the gate circuit 17 when the minimum attenuation is reached.

The use of a digital-to-analog converter for generating the currents $I_1$ and $I_2$ makes it possible, by a non-linear choice of the amplitude of $I_1$ and $I_2$ as a function of time, to minimize the harmonics associated with the error voltage (FIG. 4). In this respect it is to be noted that the control logic shown in FIG. 5 is particularly suitable to be realized by means of a programmable control unit.

What is claimed is:

1. A signal transfer device having a transfer characteristic which is adjustable in steps comprising, at least one group of controllable switches for transferring a signal from different inputs to an output, control means for turning on said switches one at a time with the switches being turned on and off by means of a control signal, and a control-signal generator for generating a first control signal which gradually varies in time for gradually turning on a specific switch of said group, and for generating a second control signal complementary to the first control signal for at the same time gradually turning off another switch of said group.

2. A signal transfer device as claimed in claim 1, wherein the group of switches comprises a group of differential pairs each comprising a first and a second transistor each having a base, an emitter and a collector electrode, the collector being electrodes of the first and the second transistors being coupled to the output, the base electrodes of the first transistors each individually being coupled to said different inputs, the base electrodes of the second transistors being coupled to a common terminal, and the emitter electrodes of the first and the second transistors of each pair being connected to respective controlsignal inputs for receiving said first and second control signals as a varying control current.

3. A signal-transfer device as claimed in claim 2, wherein said common terminal is connected to the output so as to obtain a negative feedback.

4. A signal transfer device as claimed in claims 2 or 3, wherein the switches can be switched on and off in a specific sequence and the control signal inputs, in said sequence, are alternately connected to a first and a second output of the control signal generator via transistor switches controlled such that only the control signal input of the transistor pair to be switched on and the control signal input of the transistor pair to be switched off are connected to the control-signal generator.

5. A signal transfer device as claimed in claims 1, 2 or 3, wherein the control signal generator comprises a digital-to-analog converter synchronized by the control means for generating the control signals.

6. A signal transfer device as claimed in claim 5 wherein the control signal generator comprises a digital up/down counter controlled by a clock signal, which clock signal also synchronizes the control means, and means for applying the count in said counter to the digital-to-analog converter as an input signal.

7. A signal transfer device as claimed in claim 4 wherein the control signal generator comprises a digital-to-analog converter synchronized by the control means thereby to generate the first and second control signals.

8. A signal transfer device as claimed in claim 4 wherein the control signal generator comprises a digital up/down counter controlled by a clock signal which also synchronizes the control means.

9. A signal transfer device as claimed in claim 1 wherein the control signal generator comprises a digital up/down counter controlled by a clock signal which also synchronizes the control means.

10. A signal transfer device having an amplitude transfer characteristic adjustable in steps comprising, an input terminal for a signal, a signal output terminal, a signal divider network having an input coupled to said input terminal and a plurality of output terminals for supplying different levels of said input signal, at least one group of controllable switches for selectively coupling the signal levels at said plurality of output terminals to said signal output terminal, and control means for turning said switches on and off one at a time, said control means including a control signal generator for generating first and second complementary control signals which gradually vary as a function of time so as to gradually turn on a given switch of said group of switches and at the same time gradually turn off another switch of said group of switches.

11. A signal transfer device as claimed in claim 10 wherein said group of switches is subdivided into first, second and third groups of controllable switches, said first and second groups of switches each having a plurality of inputs alternately connected to the output terminals of the divider network and a plurality of control terminals coupled to said control means whereby the switches of said first and second groups of switches are alternately actuated in sequence, said third group of switches having a plurality of inputs and a plurality of control terminals coupled to the control means whereby the third group of switches are actuated in sequence, and a linear attenuation network coupling output terminals of the first and second groups of switches to said plurality of inputs of said third group of switches, and wherein said signal output terminal is coupled to an output of the third group of switches.

12. A signal transfer device as claimed in claim 10 wherein said control means comprises, a source of periodic pulses, a counter having a plurality of outputs, a gate circuit coupling an output of the pulse source to an input of the counter, an inverting network having a plurality of inputs respectively connected to corresponding outputs of the counter, and a binary weighted resistor network coupled to outputs of the inverting network for deriving said first and second complementary control signals in the form of first and second gradually varying control currents in phase opposition.

13. A signal transfer device as claimed in claim 10 wherein said control signal generator provides first and second complementary control signals comprising first and second gradually varying step-like currents in phase opposition.

14. A signal transfer device as claimed in claim 13 wherein said group of switches includes a first plurality of switching transistors having base electrodes coupled to the control means to receive, in sequence, switching pulses, means coupling emitter electrodes of alternate ones of said transistors to said control signal generator to receive said first current, means coupling emitter electrodes of the other alternate transistors to said control signal generator to receive said second current, and circuit means coupling collector electrodes of the transistors to said signal output terminal.

* * * * *

UNITED STATES PATENT AND TRADEMARK OFFICE
CERTIFICATE OF CORRECTION

PATENT NO. : 4,430,609

DATED : February 7, 1984

INVENTOR(S) : THEODORUS J. VAN KESSEL ET AL

It is certified that error appears in the above-identified patent and that said Letters Patent is hereby corrected as shown below:

Claim 2, line 5, delete "being"
             line 12, change "controlsignal" to
             --control-signal--

Claim 5, line 4, change "for generating the" to
             --thereby to generate the first and
               second--

Signed and Sealed this

Seventeenth Day of September 1985

[SEAL]

Attest:

DONALD J. QUIGG

Attesting Officer

Commissioner of Patents and
Trademarks—Designate